US008194803B2

(12) United States Patent
Baum et al.

(10) Patent No.: US 8,194,803 B2
(45) Date of Patent: Jun. 5, 2012

(54) METHOD AND APPARATUS FOR REGAINING WATERMARK DATA THAT WERE EMBEDDED IN AN ORIGINAL SIGNAL BY MODIFYING SECTIONS OF SAID ORIGINAL SIGNAL IN RELATION TO AT LEAST TWO DIFFERENT REFERENCE DATA SEQUENCES

(75) Inventors: Peter Georg Baum, Hannover (DE); Michael Arnold, Isernhagen (DE)

(73) Assignee: Thomson Licensing, Boulogne-Billancourt (FR)

( * ) Notice: Subject to any disclaimer, the term of this patent is extended or adjusted under 35 U.S.C. 154(b) by 323 days.

(21) Appl. No.: 12/587,423

(22) Filed: Oct. 7, 2009

(65) Prior Publication Data

US 2011/0103444 A1 May 5, 2011

(30) Foreign Application Priority Data

Oct. 10, 2008 (EP) ..................................... 08305669

(51) Int. Cl.
*H04L 1/00* (2006.01)
*H03D 1/00* (2006.01)

(52) U.S. Cl. ......................... 375/343; 375/224; 375/316

(58) Field of Classification Search .................. 375/342, 375/343, 316, 324
See application file for complete search history.

(56) References Cited

U.S. PATENT DOCUMENTS

| | | | | |
|---|---|---|---|---|
| 7,230,980 | B2 * | 6/2007 | Langford et al. | 375/219 |
| 8,000,381 | B2 * | 8/2011 | Whitehead et al. | 375/150 |
| 2008/0205494 | A1 * | 8/2008 | Whitehead et al. | 375/150 |

FOREIGN PATENT DOCUMENTS

EP 1764780 A 3/2007

OTHER PUBLICATIONS

Search Report dated Feb. 17, 2009.

* cited by examiner

*Primary Examiner* — Ted Wang
(74) *Attorney, Agent, or Firm* — Robert D. Shedd; Jeffrey M. Navon; Jerome G. Schaefer

(57) ABSTRACT

Every watermarking processing needs a detection metric to decide at decoder side whether audio signal content is marked, and which symbol is embedded inside the audio signal content. The invention provides a new detection metric that achieves a reliable detection of watermarks in the presence of additional noise and echoes. This is performed by taking into account the information contained in the echoes of the received audio signal in the decision metric and comparing it with the corresponding metric obtained from decoding a non-marked audio signal, based on calculating the false positive detection rates of the reference sequences for multiple peaks. The watermark symbol corresponding to the reference sequence having the lowest false positive error is selected as the embedded one.

16 Claims, 6 Drawing Sheets

METHOD AND APPARATUS FOR REGAINING WATERMARK DATA THAT WERE EMBEDDED IN AN ORIGINAL SIGNAL BY MODIFYING SECTIONS OF SAID ORIGINAL SIGNAL IN RELATION TO AT LEAST TWO DIFFERENT REFERENCE DATA SEQUENCES

This application claims the benefit, under 35 U.S.C. §119, of European Patent Application No. 08305669.7 of 10 Oct. 2008.

FIELD OF THE INVENTION

The invention relates to a method and to an apparatus for regaining watermark data that were embedded in an original signal by modifying sections of said original signal in relation to at least two different reference data sequences.

BACKGROUND OF THE INVENTION

Watermarking of audio signals intends to manipulate the audio signal in a way that the changes in the audio content cannot be recognized by the human auditory system. Many audio watermarking technologies add to the original audio signal a spread spectrum signal covering the whole frequency spectrum of the audio signal, or insert into the original audio signal one or more carriers which are modulated with a spread spectrum signal. At decoder or receiving side, in most cases the embedded reference symbols and thereby the watermark signal bits are detected using correlation with one or more reference bit sequences. For audio signals which include noise and/or echoes, e.g. acoustically received audio signals, it may be difficult to retrieve and decode the watermark signals at decoder side in a reliable way. For example, in EP 1764780 A1, U.S. Pat. No. 6,584,138 B1 and U.S. Pat. No. 6,061,793 the detection of watermark signals using correlation is described. In EP 1764780 A1, the phase of the audio signal is manipulated within the frequency domain by the phase of a reference phase sequence, followed by transform into time domain. The allowable amplitude of the phase changes in the frequency domain is controlled according to psycho-acoustic principles.

SUMMARY OF THE INVENTION

Every watermarking processing needs a detection metric to decide at decoder or receiving side whether or not signal content is marked. If it is marked, the detection metric has furthermore to decide which symbol is embedded inside the audio or video signal content. Therefore the detection metric should achieve three features:

- a low false positive rate, i.e. it should rarely classify a non-marked signal content as marked;
- a high hit rate, i.e. it should identify correctly embedded symbols if the received signal content is marked. This is especially difficult if the marked signal content has been altered, for example by playing it in a reverberating environment and capturing the sound with a microphone;
- the metric can be easily adapted to a given false positive rate limit, because customers of the technology often require that the processing does not exceed a predetermined false positive rate.

With known detection metrics this adaptation is performed by running a large number of tests and adapting accordingly a related internal threshold value, i.e. known detection metrics do not achieve the above three features in the presence of additional noise and echoes.

A problem to be solved by the invention is to provide a new detection metric for watermarked signals that achieves the above three requirements.

According to the invention, a reliable detection of audio watermarks is enabled in the presence of additional noise and echoes. This is performed by taking into account the information contained in the echoes of the received audio signal in the decision metric and comparing it with the metric obtained from decoding a non-marked signal. The decision metric is based on calculating the false positive detection rates of the reference sequences for multiple peaks. The symbol corresponding to the reference sequence having the lowest false positive detection rate (i.e. the lowest false positive error) is selected as the embedded one.

In particular when echoes and reverberation have been added to the watermarked signal content, the inventive processing at receiver side leads to a lower rate of false positives and a higher 'hit rate', i.e. detection rate. A single value only needs to be changed for adapting the metric to a false positive limit provided by a customer, i.e. for controlling the application-dependent false positive rate.

A reasonable lower probability threshold for the 'false positive' detection rate is for example $P=10^{-6}$ (i.e. the area below $f(m|H_0)$ in FIG. 8 denoted by 'I' right hand of t). If that rate is less than threshold P, the decision is taken that the content is marked. This means that in one million tests only one false positive detection is expected.

In principle, the inventive method is suited for regaining watermark data that were embedded in an original signal by modifying sections of said original signal in relation to at least two different reference data sequences, wherein a modified signal section is denoted as 'marked' and an original signal section is denoted as 'non-marked', said method including the steps:

- correlating in each case a current section of a received version of said watermarked signal with candidates of said reference data sequences, wherein said received watermarked signal can include noise and/or echoes;
- based on the correlation result values for said current signal section,
- optionally determining whether said current signal section is non-marked and if not true, carrying out the following steps;
- determining for each one of said candidate reference data sequences, based on two or more significant peaks in said correlation result values, the false positive error, wherein said false positive error is derived from the power density function of the amplitudes of the correlation result for a non-marked signal section and from a first threshold value related to said power density function;
- selecting for said current signal section that one of said candidate reference data sequences which has the lowest false positive error, in order to provide said watermark data.

In principle the inventive apparatus is suited for regaining watermark data that were embedded in an original signal by modifying sections of said original signal in relation to at least two different reference data sequences, wherein a modified signal section is denoted as 'marked' and an original signal section is denoted as 'non-marked', said apparatus including means being adapted for:

- correlating in each case a current signal section of a received version of said watermarked signal with candidates of said reference data sequences, wherein said received watermarked signal can include noise and/or echoes;

based on the correlation result values for said current signal section, optionally determining whether said current signal section is non-marked and if not true, carrying out the following steps;

determining for each one of said candidate reference data sequences, based on two or more significant peaks in said correlation result values, the false positive error, wherein said false positive error is derived from the power density function of the amplitudes of the correlation result for a non-marked signal section and from a first threshold value related to said power density function;

selecting for said current signal section that one of said candidate reference data sequences which has the lowest false positive error, in order to provide said watermark data.

BRIEF DESCRIPTION OF THE DRAWINGS

Exemplary embodiments of the invention are described with reference to the accompanying drawings, which show in.

DETAILED DESCRIPTION

Figure 1:
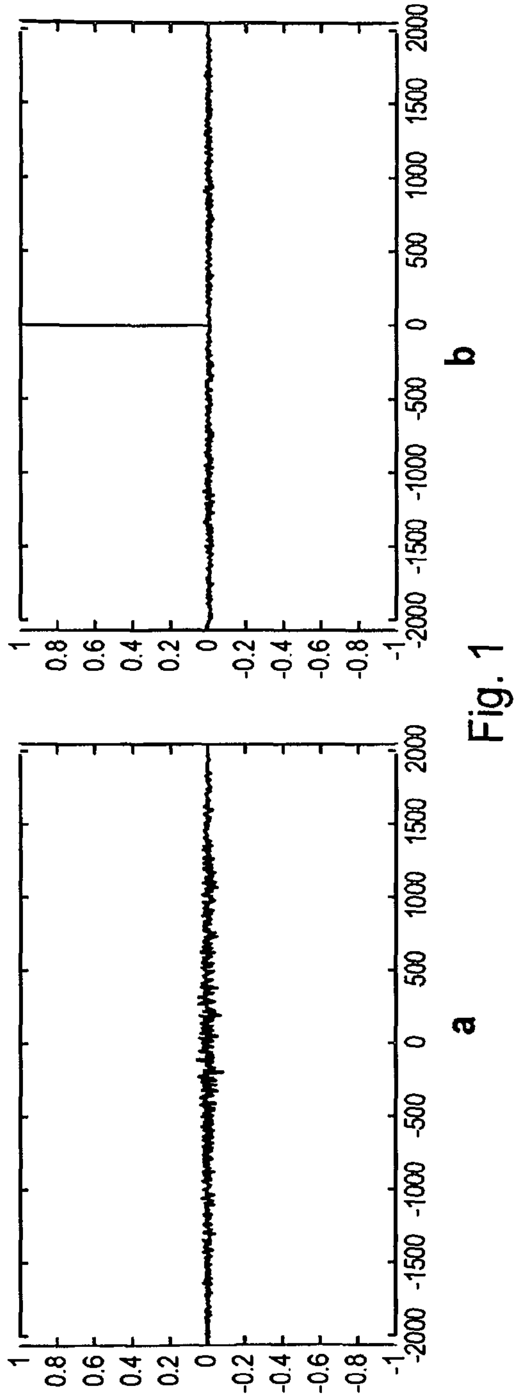
FIG. 1 plot of non-matching and matching correlation result values.

The inventive watermarking processing uses a correlation-based detector. Like in the prior art, a current block of a possibly watermarked audio (or video) signal is correlated with one or more reference sequences or patterns, each one of them representing a different symbol. The pattern with the best match is selected and its corresponding symbol is fed to the downstream error correction.

But, according to the invention, the power density function of the amplitudes of the result values of the correlation with one section of non-marked (audio) signal content is estimated, and then it is decided if the highest correlation result amplitudes of the current correlated sequences belong also to the non-marked content. In the decision step, the probability that the amplitude distribution of the current correlation result values does match that estimated power density function of the non-marked signal content is calculated. If the calculated false positive probability is close to e.g. '0' the decision is taken that the content is marked. The symbol having the lowest false positive probability is supposed to be embedded.

In order to decide what the 'best match' is, for demonstration purposes a number of numRef (e.g. numRef=7) reference pattern are generated, which are correlated with the watermarked audio track (in Matlab notation; pi=π):

```
rand('seed',0)
numRef = 7;
N = 2048;
NSpec = N/2 + 1;
for k = 1:numRef
    ang = rand(NSpec, 1)*2*pi;
    ref{k} = irfft(cos(ang) + i*sin(ang));
end
```

The following subsections present different cases according to the kind of processing which can happen to a watermarked audio track. The effect of such processing on the correlation is simulated by experiments and discussed to describe the problem of watermark detection if the watermarked audio file is transmitted over an acoustic path.

No Alteration of Watermarked Audio Track

In the undisturbed case (i.e. no noise/echo/reverberation), the difference between a match and a non-match is clear, cf. the correlation of the reference signal with an other reference pattern representing the non-matching case in FIG. 1*a* and the correlation of the signal with itself demonstrating the matching case in FIG. 1*b*.

```
% Use the first reference pattern as the 'signal'
  signal=ref{1};
% Whiten the signal and correlate it with itself to simulate
% the matching case. Correlate it with an other reference
% signal to simulate the non-matching case
  signal=irfft(sign(rfft(signal)));
  [noMatch t]=xcorr(signal, ref{2});
  [match t]=xcorr(signal, ref{1});
% Plot non-matching and matching sequences
  ax=[(−N+1) (N−1) −1 1];
  figure; plot(t, noMatch); axis(ax);
    print(gcf, '-depsc2', 'noMatch.eps');
  figure; plot(t, match); axis(ax);
    print(gcf, '-depsc2', 'match.eps');
```

The corresponding result is shown in FIG. 1*a* (non-matching) and FIG. 1*b* (matching), wherein the vertical axis shows correlation result values between '−1' and '+1' and the horizontal axis shows values from '−2048' to '+2048'.

Adding Noise to the Watermarked Audio Track

In case of disturbed signals the detection and distinction between a match and a non-match becomes more difficult. This can be demonstrated by adding noise to the original reference pattern and calculating the correlation with an other reference pattern representing the non-matching case (cf. FIG. 2*a*), and the correlation with the original reference pattern demonstrating the matching case (cf. FIG. 2*b*):

```
  rand('seed', 1)
% Generate noise and add it to the signal
  noise=0.8*(rand(N, 1)−0.5);
  signal=ref(1)+noise;
% Whiten noise corrupted signal and correlate with original
% signal to simulate the matching case. Correlate corrupted
% signal with other reference pattern to simulate non-
% matching case
  signal=irfft(sign(rfft(signal)));
  [noMatch t]=xcorr(signal, ref{2});
  [match t]=xcorr(signal, ref{1});
% Plot non-matching and matching sequences in the presence
% of noise
  ax=[(−N+1) (N−1)−0.2 0.2];
  figure; plot(t, noMatch); axis(ax);
    print(gcf, '-depsc2', 'noMatchNoise.eps');
  figure; plot(t, match); axis(ax);
    print(gcf, '-depsc2', 'matchNoise.eps');
```

The corresponding result is shown in FIG. 2a (non-matching) and FIG. 2b (matching) with the same horizontal scaling as used in FIG. 1, whereas the vertical axis shows correlation result values between '−0.2' and '+0.2'. In the matching case the maximum result value of the correlation is reduced by a factor of about '10' in comparison to the corresponding result value obtained in FIG. 1b.

Adding Noise and Echoes to the Watermarked Audio Track

The detection and distinction between a match and a non-match becomes even more difficult, if less noise but in addition echoes are included:

```
rand('seed', 2)
% Add noise and echoes to signal ref(1)
noise=0.6*(rand(N, 1)−0.5);
signal=filter([1 0 0 0 0 0 −0.8 −0.4 0 0 0 0 0 0.3 0.2], . . . ,
  [1 0 0 0 0 −0.3], ref{1})+noise;
% Whiten noise and echo corrupted signal and correlate with
% original signal to simulate the matching case. Correlate
% corrupted signal with other reference pattern to simulate
% non-matching case
signal=irfft(sign(rfft(signal)));
[noMatch t]=xcorr (signal, ref{2});
[match t]=xcorr (signal, ref(1));
% Plot non-matching and matching sequences in the presence
% of noise and echoes
ax=[(−N+1) (N−1)−0.2 0.2];
figure; plot(t, noMatch); axis(ax);
  print (gcf, '-depsc2', 'noMatchEcho.eps');
figure; plot(t, match); axis(ax);
  print (gcf, '-depsc2', 'matchEcho.eps');
```

Figure 2:
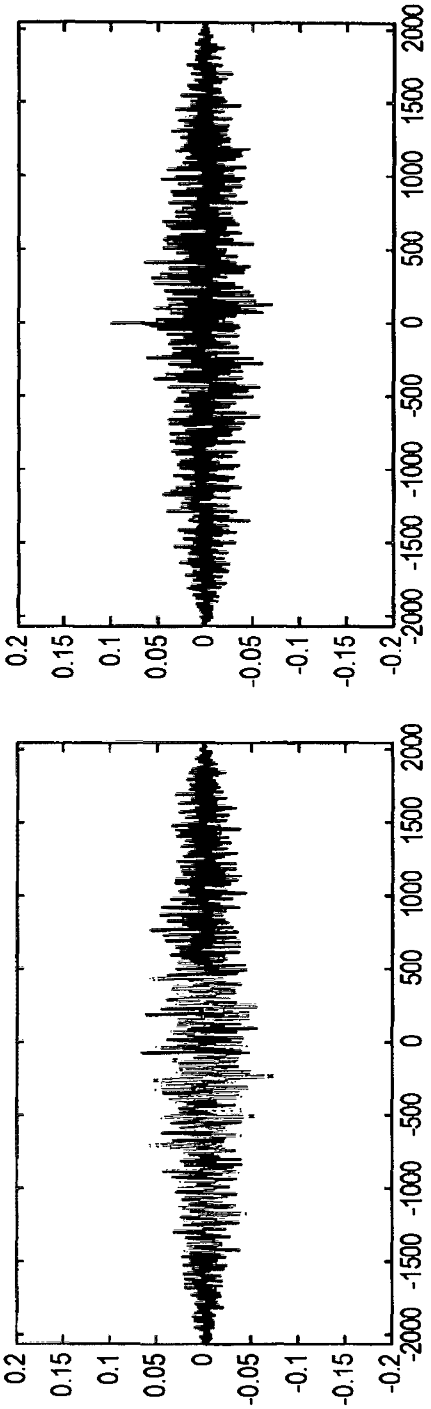
FIG. 2 plot of non-matching and matching correlation result values in the presence of additional noise.
Figure 3:
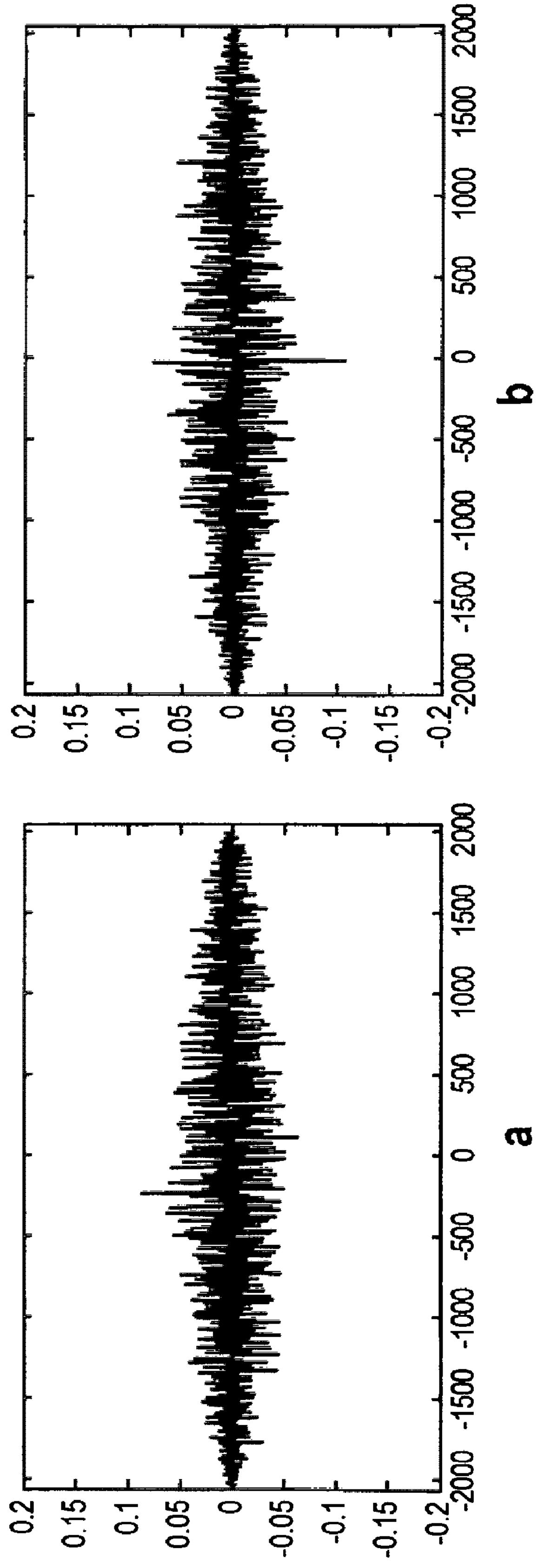
FIG. 3 plot of non-matching and matching correlation result values in the presence of additional noise and echo.

The corresponding result is shown in FIG. 3a (non-matching) and FIG. 3b (matching) with the same scaling as used in FIG. 2.

The problem to be solved is to define a decision metric that can reliably distinguish between the non-matching case and the matching case, in the presence of noise and echoes. These types of signal disturbances will typically happen if the watermarked audio signals or tracks are transmitted over an acoustic path.

Decision Theory

A reliable decision metric (also called 'test statistic') denoted by m should minimize the errors involved in the decisions. For correlation-based processings, the appropriate test statistic m is defined as a function of the magnitudes of the correlation result values. A 'test hypothesis' $H_0$ and an 'alternative hypothesis' $H_1$ are formulated. The random variable m is following two different distributions $f(m|H_0)$ in the original (i.e. non-marked) case and $f(m|H_1)$ in the marked case, between which it is differentiated by comparison with a threshold value t. Such hypothesis test decision basis can be formulated by:

$H_0$: in case the test statistic is following the distribution $f(m|H_0)$ the audio track carries no watermark;

$H_1$: in case the test statistic does not follow the distribution $f(m|H_0)$ the audio data is carrying a watermark.

Figure 8:
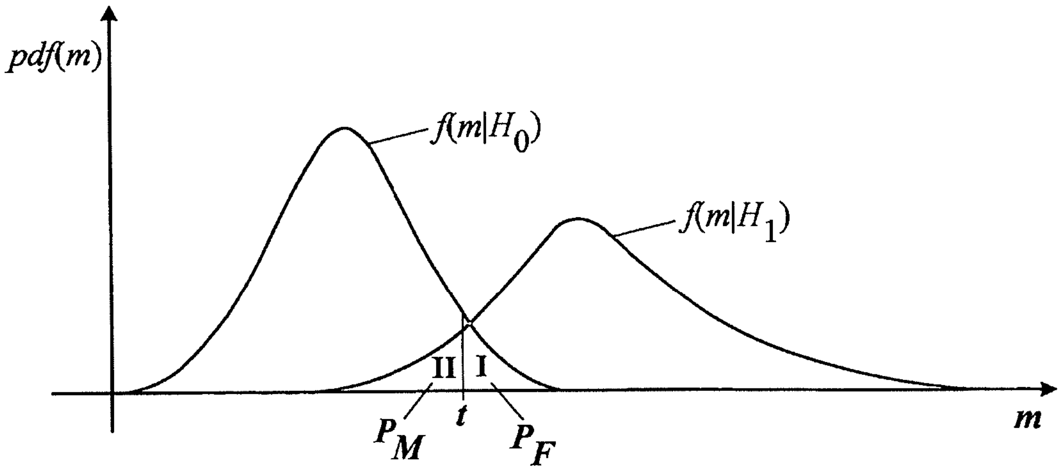
FIG. 8 distributions and error probabilities.

Due to the overlap of the corresponding two probability density functions, four different decisions are possible with respect to the defined threshold value t, see Table 1 and FIG. 8 wherein the horizontal axis corresponds to m and the vertical axis corresponds to pdf(m).

TABLE 1

| | | True status | |
|---|---|---|---|
| | | $H_0$ is true (not marked) | $H_1$ is true (marked) |
| Decision | $H_0$ accepted (not marked) | Correct $(1 - P_F)$ | Wrong rejection $P_M$ |
| | $H_1$ accepted (marked) | Wrong acceptance $P_F$ | Correct $(1 - P_M)$ |

True States, Decisions and Corresponding Probabilities

The detection process is based on the calculation of the test statistic m against the threshold or 'critical value' t. The two error types incorporated in hypothesis testing are the false positive and the false negative (missing) errors.

$$\int_t^{+\infty} f(m \mid H_0)\,dm = P_F \text{ (Type I error or 'false positive')} \tag{1}$$

$$\int_{-\infty}^{t} f(m \mid H_1)\,dm = P_M \text{ (Type II error or 'false negative')} \tag{2}$$

$P_F$ is the conditional probability for a false positive, and corresponds to area I to the right side of m=t and below function $f(m|H_0)$ and the total area under this function is normalized to '1'. $P_M$ is the conditional probability for missing the detection, and corresponds to the area II to the left side of m=t and below function $f(m|H_1)$ and the total area under this function is normalized to '1'. The threshold value t is derived from the desired decision error rates depending on the application. Usually, this requires the in-advance knowledge of the distribution functions $f(m|H_0)$ and $f(m|H_1)$.

The distribution function $f(m|H_0)$ belonging to the non-marked case can be modeled (see section SOME OBSERVATIONS), but the distribution function $f(m|H_1)$ depends on the processes that can occur during embedding and detection of the watermark in the audio signal and is therefore not known in advance. A derivation of the threshold value t is therefore calculated from equation (1) for a given false detection probability $P_F$, and the processing according to the invention does not make use of a distribution function $f(m|H_1)$.

The following two sections describe known approaches for the definition of a suitable decision metric m for the detection of the watermark.

Maximum Peak

The easiest and mostly used solution is to calculate the absolute maximum result value $m_i=\max(|xx_i|)$, for i=1, . . . , N of the N candidate correlations $xx_i$, followed by searching for the maximum $mm=\max\forall_i(m_i)$ of these maxima. The symbol that corresponds to the correlation with this maximum mm is used as resulting detected symbol.

In this case the metric m to be determined should satisfy the following equations (3) and (4), with $m_x$ being the metric of correlation number x, and $a_x$ being the maximum amplitude of correlation number x:

$$a_1>a_2 \Leftrightarrow m_1>m_2 \tag{3}$$

$$a_1==a_2 \Leftrightarrow m_1==m_2 \tag{4}$$

For some error correction processing it is helpful to use, in addition to the resulting symbol, a 'detection strength' (i.e. weighting) that is usually in the range between '0' and '1'. In this case the error correction can take advantage of the fact that the symbols which are detected with a high strength value do have a lower probability of having been detected with a wrong value than the symbols which are detected with a low detection strength.

Either the ratio of the absolute maximum to the theoretical possible maximum, or the ratio of the largest absolute maximum to the second largest absolute maximum in $m_i$ can be used. The latter is to be clipped to '1' because its value is not bound, cf. application PCT/US2007/014037.

In this 'Maximum Peak' processing it is assumed that the $N_{peaks}$ greatest peaks belong to different sequences, with the maximum correlation corresponding to the sequence embedded. This processing is very easy and works well for 'attacks' like mp3 encoded audio signals. But it shows its limits if not only one but several peaks belonging to the same sequence are appearing in the correlation result, which will happen e.g. due to echoes if the watermarked signal is captured with a microphone.

Peak Accumulation

In peak accumulation processing it is tried to circumvent the shortcomings of the maximum peak technique by taking multiple peaks in one correlation result into account, cf. application EP08100694.2. This processing works very well but many threshold values or constant values are required for distinguishing between noise and 'real' peaks. These constant values can be determined by an optimization process based on many recordings, but in the end they are chosen arbitrarily and one never knows if these parameters will work equally well for all kind of audio tracks or signals. Further, the meaning of a single correlation value is well-defined, but there is no unambiguous mathematical way of how to combine several correlation values into a single detection strength value that has a similarly clear meaning.

Statistical Detector

This section describes new solutions as well as improvements of the above known solutions for detecting a watermark with respect to the transmission of audio watermarked content over an acoustic path.

The inventive statistical detector combines the advantages of the 'Maximum Peak' processing and few arbitrarily chosen constant values with the advantages of the 'Peak Accumulation' processing, resulting in a very good detection in the presence of multiple correlation result peaks belonging to the same embedded sequence.

Some Observations

The amplitudes distribution of the circular correlation of non-correlated, whitened signals appears to be a Gaussian one with a mean value of zero:

```
rand('seed', 0)
N=16*1024;
stepSize=0.0001;
signal=sign(rfft(rand(N, 1)));
edges=(−0.03):stepSize:0.03;
hist=zeros(size(edges'));
numTest=1000;
st=0;
mm=0;
```

wherein 'edges' represents a vector of bins for histogram calculation.

```
% Correlate signal with numRef random reference signals
```

```
for k = 1:numTest
    s2 = sign(rfft(rand(N, 1)));
    xx = irfft(s2.*signal);
    mm = mm + mean(xx);
```

-continued

```
    st = st + xx'*xx;
    % Count number of values in xx which fall between the
    % elements in the edges vector
    hist = hist + histc(xx, edges);
end
```

```
% Estimate standard deviation and calculate Gaussian density
% function
st=st/(numTest*N−1);
gauss=1/sqrt(2*pi*st)*exp(edges.^2/−2/st);
% Calculate histogram of measured amplitude distribution and
% compare it to the Gaussian density function
hist=hist/numTest/N/stepSize;
figure; plot(edges, hist, edges, gauss);
    print (gcf, '-depsc2', 'gauss.eps');
```

Figure 4:
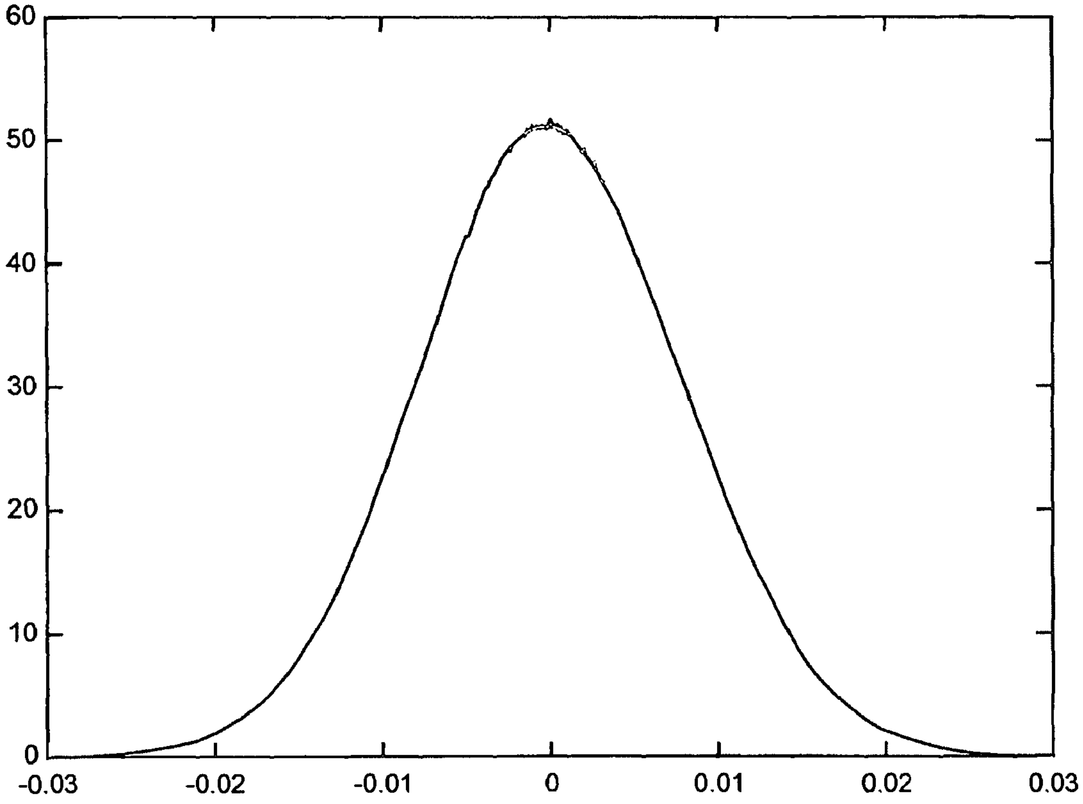
FIG. 4 amplitude distribution of the correlation of non-matching reference sequences in comparison with the calculated theoretical Gaussian distribution.

The corresponding result is shown in FIG. 4 and demonstrates that the measured function matches nearly perfectly the Gaussian density function. This is also true for the normal, non-circular correlation if only a small fraction of the values in the middle of the correlation are taken into account.

Of course, the result amplitude values of the correlation of two matching sequences are not Gaussian distributed because the result amplitude value is '1' for Δt=0 (here, t means time) and '0' everywhere else. But if the two sequences are only somewhat correlated, which is the case when a reference sequence is correlated with an audio signal that is watermarked with this reference sequence, the distribution of the correlation result amplitude values is nearly Gaussian distributed. This is apparent when zooming in, see FIG. 5*b*.

```
rand('seed', 0)
N=16*1024;
stepSize=0.001;
numTest=1000;
timeSignal=rand(N, 1);
specSignal=conj(sign(rfft(timeSignal)));
edges=(−0.1):stepSize:0.1;
hist=zeros(size(edges'));
st=0;
% Correlate signal with numTest signals containing part of
% the reference signal
for k=1:numTest
    s2=sign(rfft(rand(N, 1)+0.1*timeSignal));
    xx=irfft(s2.*specSignal);
    mm=mm+mean(xx);
    st=st+xx'*xx;
    % Count number of values in xx which fall between the
    % elements in the edges vector
    hist=hist+histc(xx, edges);
end
% Estimate standard deviation and calculate Gaussian density
% function
st=st/(numTest*N−1);
st=stOrig;
gauss=1/sqrt(2*pi*st)*exp(edges.^2/−2/st);
% Calculate histogram of measured amplitude distribution and
% compare it to the Gaussian density function
hist=hist/numTest/N/stepSize;
figure; plot(edges, hist, edges, gauss);
    print(gcf, '-depsc2', 'gaussMatch.eps');
axis([min(edges) max(edges) 0 0.1])
    print(gcf, '-depsc2', 'gaussMatchZoom.eps');
```

Figure 5:
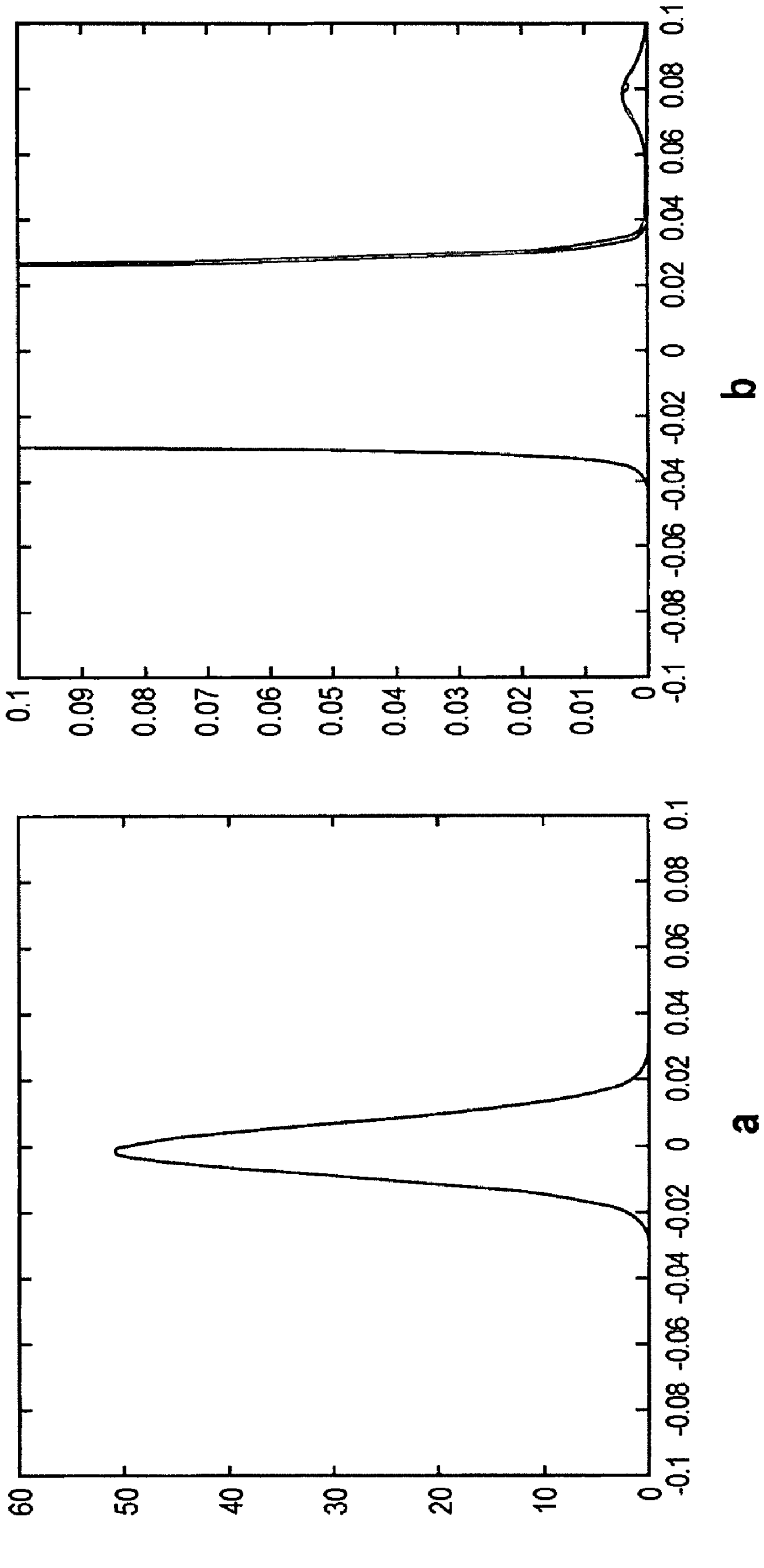
FIG. 5 amplitude distribution of the correlation of two slightly correlated reference sequences in comparison with the calculated theoretical Gaussian distribution.

The corresponding result is shown in FIG. 5*a* and FIG. 5*b*. FIG. 5*a* shows FIG. 4 with a coarser horizontal scaling, and FIG. 5*b* shows FIG. 5*a* in a strongly vertically zoomed manner. Due to such zooming, a significant difference between both curves becomes visible within a horizontal range of about +0.06 and +0.1. The invention makes use of this difference for improving the detection reliability.

The $\chi^2$-test is a well-known mathematical algorithm for testing whether given sample values follow a given distribution, i.e. whether or not the differences between the sample values and the given distribution are significant. Basically, this test is carried out by comparing the actual number of sample values lying within a given amplitude range with the expected number as calculated with the given distribution. The problem is that this amplitude range must include at least one expected sample value for applying the $\chi^2$-test, which means that this test cannot distinguish a correlation with a peak height of 0.9 from one with a peak height of 0.4 because theory does not expect any peaks, neither in the neighborhood of 0.9 nor in the neighborhood of 0.4 (for real-world correlation lengths).

The Statistical Processing

Instead of using a value range like the $\chi^2$-test, the inventive statistical detector calculates for a number $N_{peaks}$ of significant (i.e. largest) peaks in the correlation result whether they match the theoretically expected (i.e. a predetermined) peak distribution in the non-marked case. A Gaussian distribution with standard deviation σ and a mean value of '0' has the probability density function $$f(x) = \frac{1}{\sigma\sqrt{2\pi}} e^{-\frac{1}{2}\left(\frac{x}{\sigma}\right)^2}, \tag{5}$$

which means, that the probability of a peak having a magnitude ≧m is $$p(m) = \int_m^\infty \frac{1}{\sigma\sqrt{2\pi}} e^{-\frac{1}{2}\left(\frac{x}{\sigma}\right)^2} dx \tag{6}$$

$$= \frac{1}{2} - \int_0^m \frac{1}{\sigma\sqrt{2\pi}} e^{-\frac{1}{2}\left(\frac{x}{\sigma}\right)^2} dx \tag{7}$$

$$= \frac{1}{2}\left(1 - \text{erf}\left(\frac{m}{\sigma\sqrt{2}}\right)\right), \tag{8}$$

where 'erf' represents the error function.

Then, for N values, the number $n_e(m)$ of expected peaks having a magnitude ≧m is $$n_e(m) = \text{Np}(m) \tag{9}$$

$$= \frac{N}{2}\left(1 - \text{erf}\left(\frac{m}{\sigma\sqrt{2}}\right)\right) \tag{10}$$

The standard deviation σ can be either pre-computed if the signal model is known and some normalization steps are carried out, or it can be calculated in real-time, for example over all correlations of all candidate sequences.

As an alternative, for a current input signal section the distribution for the non-marked case can be calculated from the sets of correlation result values for correlations with the wrong reference data sequences.

The following sections describe two new solutions, which take advantage of comparing non-marked with marked distributions by incorporating probabilities for false detections (p(m) in equation 8) and corresponding threshold values (m in equation 10). Both solutions use a given number of peaks $N_{peaks}$ for improving the decision in the presence of additional noise and echoes.

Comparing Difference Amplitudes

Because the difference of the probability density functions of amplitudes is very small an other solution is to compare the amplitudes $M_{N_{peaks}}$ for obtaining a specified number of peaks for the different reference sequences with the unmarked case. To control the false positive rate, i.e. the percentage in which the detector determines that a mark is present in non-marked content, it is desirable to set a pre-determined threshold value t. For example, a threshold $t_f$=0.01 means that in one out of one hundred tests $n_e(m_{t_f})$ peaks have values greater than $m_{t_f}$ and a non-marked signal will be classified as marked. Advantageously, this threshold can be easily integrated into equation (10):

$$t_f n_e(m_{t_f}) = \text{Np}(m_{t_f}) \tag{11}$$

$$= \frac{N}{2}\left(1 - \text{erf}\left(\frac{m_{t_f}}{\sigma\sqrt{2}}\right)\right). \tag{12}$$

To handle negative and positive peaks in the same way, the absolute value of the peaks is taken, which means for the expected number of peaks with an absolute value ≧$m_{t_f}$ $$t_f n_e(m_{t_f}) = N\left(1 - \text{erf}\left(\frac{m_{t_f}}{\sqrt{2}\,\sigma}\right)\right). \tag{13}$$

The corresponding amplitude $m_{N_{peaks}}$ in the unmarked case is ($n_e(m_{N_{peaks}})=N_{peaks}$)

$$m_{Npeaks} = \sqrt{2}\,\sigma\ \text{erf}^{-1}\left(1 - \frac{t_f N_{peaks}}{N}\right), \tag{14}$$

where $\text{erf}^{-1}$ represents the inverse error function.

Figure 6:
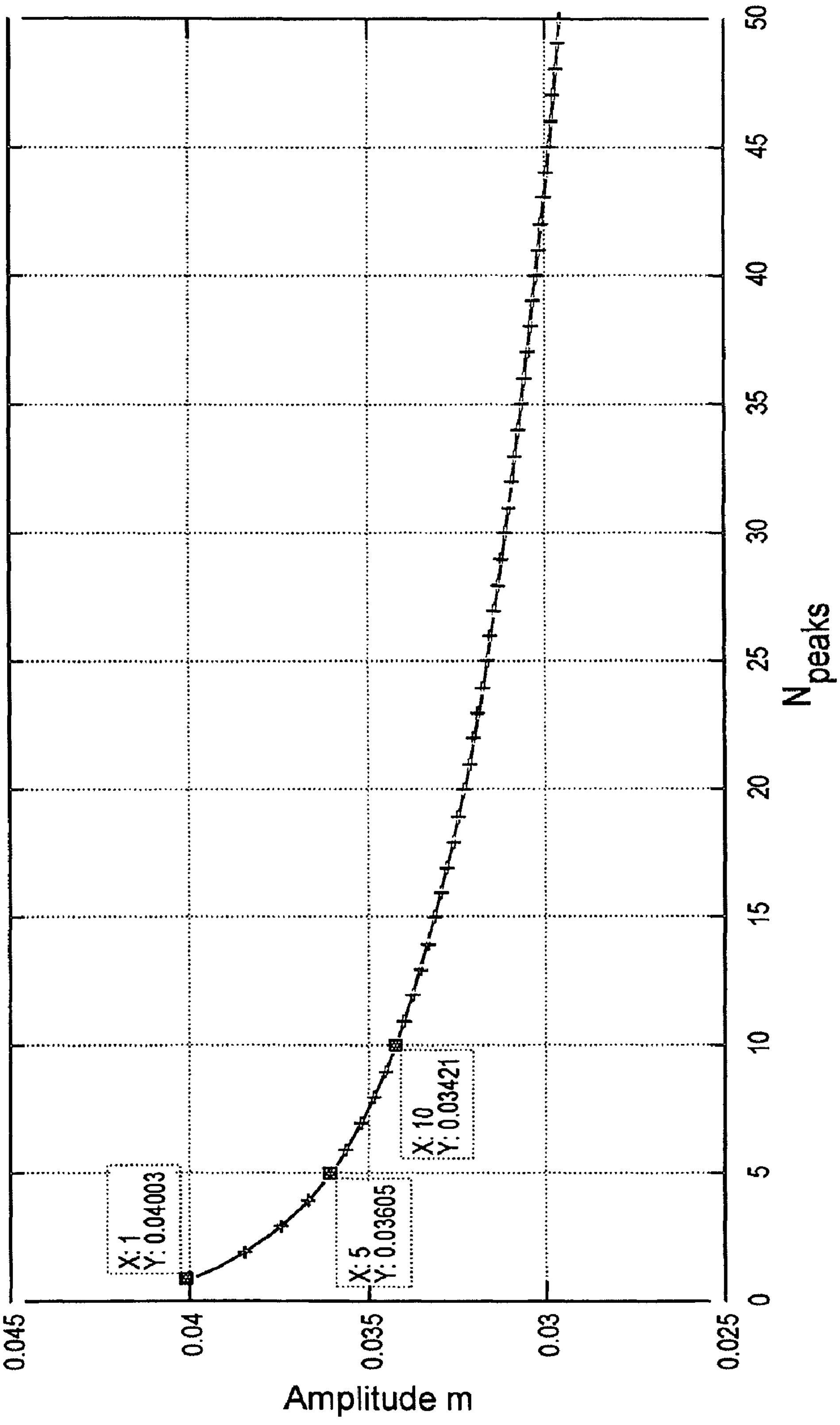
FIG. 6 amplitude m vs. number $N_{peaks}$ of peaks in the unmarked case.

For example, the amplitude value m as a function $m(N_{peaks})$ of the number of peaks is depicted in FIG. 6 for a standard deviation of σ=0.01, N=16000 and a false positive threshold value $t_f$=1.

For each sequence k the absolute values $r_i$, i=1, 2, . . . , $N_{peaks}$ for the $N_{peaks}$ largest peaks are obtained. These sorted values are compared with the sorted theoretical values $m_i$, i=1, 2, . . . , $N_{peaks}$ of the unmarked case (see equation 14) to obtain the corresponding sum $c_k$ of differences for the $N_{peaks}$ largest peaks for every sequence:

$$c_k = \sum_{i=1}^{N_{peaks}} r_i - m_i,\ \forall\, k. \tag{15}$$

Thereafter the sequence k having the maximum of all difference values $c_k$ is selected as being the embedded one.

Calculating False Positive Probabilities

For this kind of processing—like for the one described before—it is assumed that a transmission system is used in an environment with a very low signal-to-noise ratio. Additionally, the transmission channel includes multi-path reception. Due to the physical reality it is known that only the three largest echoes are relevant. For example, the correlation block length is 4096 samples. The postprocessing guarantees for the non-marked case a Gaussian distribution of the correlation values with ‘zero’ mean and a standard deviation of $\sigma$=0.01562.

The transmission system uses two reference sequences A and B for transmitting a ‘0’ symbol or a ‘1’ symbol, respectively. At a current time, the groups v of the three largest (i.e. most significant) amplitude values of the correlation result of these sequences are assumed to have the following values:

$$v_{\mathfrak{A}}=[0.07030\ 0.06080\ 0.05890] \qquad (16)$$

$$v_{\mathfrak{B}}=[0.06878\ 0.06460\ 0.05852] \qquad (17)$$

Which one of these reference sequences should be chosen as the correct one, i.e. which symbol value should be decoded? In the prior art, the sequence with the highest value would be chosen, which is $\mathfrak{A}$, and a ‘0’ symbol would be decoded. However, in the inventive statistical detector the probabilities of all three amplitudes are calculated. The probability density function is given by $$f(x)=\frac{1}{\sigma\sqrt{2\pi}}e^{-\frac{1}{2}\left(\frac{x}{\sigma}\right)^2}. \qquad (5)=(18)$$

If one sample is taken, the probability p(v) for a peak having an amplitude greater or equal $v_{\mathfrak{A}_i}$ or $v_{\mathfrak{B}_i}$, with i=1, 2, 3, can be calculated according to equation (8). The following table lists the probabilities for all six relevant amplitudes:

| Amplitude | Probability |
|---|---|
| 0.07030 | $6.80\ 10^{-6}$ |
| 0.06878 | $1.07\ 10^{-5}$ |
| 0.06460 | $3.54\ 10^{-5}$ |
| 0.06080 | $9.92\ 10^{-5}$ |
| 0.05890 | $1.627\ 10^{-4}$ |
| 0.05852 | $1.793\ 10^{-4}$ |

Because not only a single sample is taken but the whole correlation block is checked, the probability $P_k^N(p(v))$ for the occurrence of k peaks of size $\geqq v \in v_{\mathfrak{A}}$ or $v_{\mathfrak{B}}$ within a group of N samples can be calculated with the binomial distribution $$P_k^N(p(v))=\binom{N}{k}p(v)^k(1-p(v))^{N-k} \qquad (19)$$

For three peaks $v_{\mathfrak{A}_1}$, $v_{\mathfrak{A}_2}$, $v_{\mathfrak{A}_3}$ or $v_{\mathfrak{B}_1}$, $v_{\mathfrak{B}_2}$, $v_{\mathfrak{B}_3}$, respectively, denoted by $v_1$, $v_2$, $v_3$ with $v_1 \geqq v_2 \geqq v_3$ there exist four different possibilities that there are three or more values in a correlation block which are larger than or equal to these peaks:

$P_1$ three or more values are $\geqq v_1$;

$P_2$ two values are $\geqq v_1$ and one or more values are between $v_3$ and $v_1$;

$P_3$ one value is $\geqq v_1$ and two or more values are between $v_3$ and $v_2$;

$P_4$ one value is one value is between $v_2$ and $v_1$ and one value is between $v_3$ and $v_2$.

The total probability $P_{total}$ is then $$P_{total}=P_1+P_2+P_3+P_4 \qquad (20)$$

Then, for the sequences $\mathfrak{A}$ and $\mathfrak{B}$ $$P_{\mathfrak{A},total}=3.293\ 10^{-3} \qquad (21)$$

$$P_{\mathfrak{B},total}=2.373\ 10^{-3} \qquad (22)$$

The false positive probability of the occurrence of $\mathfrak{B}$ s three peaks in non-marked content is therefore lower than the probability of the occurrence of $\mathfrak{A}$s three peaks, which means that $\mathfrak{B}$ should be chosen and a ‘1’ symbol be decoded although $\mathfrak{A}$ contains a larger peak than $\mathfrak{B}$.

In a synchronization or initialization phase upon switching on the watermark detection, or also during normal operation mode, non-watermarked audio signal sections can be determined in a similar way by calculating for the current signal section for each one of the candidate reference data sequences REFP the probabilities of the e.g. three largest (i.e. most significant) peaks, followed by the steps:

- depending on the number of the three significant peaks, calculating a related number of probabilities that there are a corresponding number of values in a correlation block which are larger than or equal to these significant peaks;
- for each candidate reference data sequence, summing up the related number of probabilities so as to form a total probability value;
- regarding the current signal section as non-marked if the total probability values for all candidate reference data sequences are smaller than a predetermined threshold value, e.g. $10^{-3}$.

Figure 7:
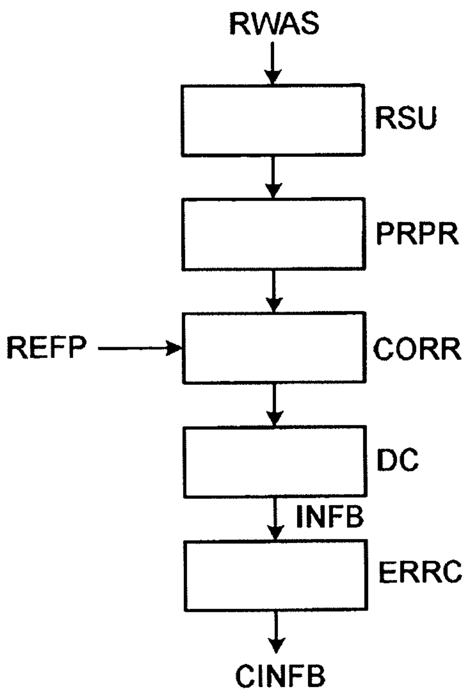
FIG. 7 block diagram of an inventive watermark decoder.

In the watermark decoder block diagram in FIG. 7, a received watermarked signal RWAS is re-sampled in a receiving section step or unit RSU, and thereafter may pass through a preprocessing step or stage PRPR wherein a spectral shaping and/or whitening is carried out. In the following correlation step or stage CORR it is correlated section by section with one or more reference patterns REFP. A decision step or stage DC determines, according to the inventive processing described above, whether or not a correlation result peak is present and the corresponding watermark symbol. In an optional downstream error correction step or stage ERRC the preliminarily determined watermark information bits INFB of such symbols can be error corrected, resulting in corrected watermark information bits CINFB.

The invention is applicable to all technical fields where a correlation-based detection is used, e.g. watermarking or communication technologies.

The invention claimed is:

1. Method for regaining watermark data that were embedded in an original signal by modifying sections of said original signal in relation to at least two different reference data sequences, wherein a modified signal section is denoted as ‘marked’ and an original signal section is denoted as ‘non-marked’, said method including the steps:

- correlating in each case a current section of a received version of said watermarked signal with candidates of said reference data sequences, wherein said received watermarked signal can include noise and/or echoes;
- based on the correlation result values for said current signal section,
- optionally determining whether said current signal section is non-marked and if not true, carrying out the following steps;
- determining for each one of said candidate reference data sequences, based on two or more significant peaks in said correlation result values, the false positive probability, wherein said false positive probability is derived from the probability density function of the amplitudes of the correlation result for a non-marked signal section and from a first threshold value related to said probability density function;

selecting for said current signal section that one of said candidate reference data sequences which has the lowest false positive probability, in order to provide said watermark data.

2. Method according to claim 1, wherein said signal is an audio signal or a video signal.

3. Method according to claim 1, wherein said determining whether said current signal section is non-marked is carried out by calculating for said current signal section for each one of said candidate reference data sequences the probabilities of said two or more most significant peaks, followed by the steps:

depending on the number of said two or more most significant peaks, calculating a related number of probabilities that there are a corresponding number of two or more magnitude values in a correlation block which are larger than or equal to these significant peaks;

for each candidate reference data sequence, summing up said related number of probabilities so as to form a total probability value;

regarding said current signal section as non-marked if said total probability values for all candidate reference data sequences are less than a predetermined second threshold value.

4. Method according to claim 3, wherein said determination of non-marked signal sections is carried out only in a synchronization or initialization phase of said regaining of watermark data.

5. Method according to claim 1 wherein, for determining said false positive probability, it is calculated for said two or more most significant peaks in said correlation result values whether they match a predetermined probability of a corresponding number of most significant peaks for non-marked signal sections.

6. Method according to claim 1, wherein for said current signal section for each one of said candidate reference data sequences the probabilities of said two or more most significant peaks are calculated, followed by the steps:

depending on the number of said two or more most significant peaks, calculating a related number of probabilities that there are a corresponding number of two or more magnitude values in a correlation block which are larger than or equal to these significant peaks;

for each candidate reference data sequence, summing up said related number of probabilities so as to form a total probability value;

regarding that candidate reference data sequence to which the lowest one of said total probability values is assigned as the one having said lowest false positive error.

7. Method according to claim 1, wherein for said current signal section:

a predetermined number of largest magnitude peak values in the correlation result values for non-marked signal content is obtained and these peaks are sorted according to their size, and for each one of said candidate reference data sequences said predetermined number of largest magnitude peak values in the correlation result values is obtained and these peak values are sorted according to their size;

for each one of said candidate reference data sequences said predetermined largest magnitude peak values number of difference values between corresponding pairs of largest magnitude values of the current candidate reference data sequence and for non-marked content are summed up;

selecting that candidate reference data sequence for which the maximum sum of difference values was calculated as the one which was used for marking said current signal section.

8. Method according to claim 1, wherein said second threshold value is smaller than said first threshold value.

9. Apparatus for regaining watermark data that were embedded in an original signal by modifying sections of said original signal in relation to at least two different reference data sequences, wherein a modified signal section is denoted as 'marked' and an original signal section is denoted as 'non-marked', said apparatus including means being adapted for:

correlating in each case a current signal section of a received version of said watermarked signal with candidates of said reference data sequences, wherein said received watermarked signal can include noise and/or echoes;

based on the correlation result values for said current signal section, optionally determining whether said current signal section is non-marked and if not true, carrying out the following steps;

determining for each one of said candidate reference data sequences, based on two or more significant peaks in said correlation result values, the false positive probability, wherein said false positive probability is derived from the probability density function of the amplitudes of the correlation result for a non-marked signal section and from a first threshold value related to said probability density function;

selecting for said current signal section that one of said candidate reference data sequences which has the lowest false positive probability, in order to provide said watermark data.

10. Apparatus according to claim 9, wherein said signal is an audio signal or a video signal.

11. Apparatus according to claim 9, wherein said determining whether said current signal section is non-marked is carried out by calculating for said current signal section for each one of said candidate reference data sequences the probabilities of said two or more most significant peaks, followed by the steps:

depending on the number of said two or more most significant peaks, calculating a related number of probabilities that there are a corresponding number of two or more magnitude values in a correlation block which are larger than or equal to these significant peaks;

for each candidate reference data sequence, summing up said related number of probabilities so as to form a total probability value;

regarding said current signal section as non-marked if said total probability values for all candidate reference data sequences are less than a predetermined second threshold value.

12. Apparatus according to claim 11, wherein said determination of non-marked signal sections is carried out only in a synchronization or initialization phase of said regaining of watermark data.

13. Apparatus according to claim 9 wherein, for determining said false positive probability, it is calculated for said two or more most significant peaks in said correlation result values whether they match a predetermined probability of a corresponding number of most significant peaks for non-marked signal sections.

14. Apparatus according to claim 9, wherein for said current signal section for each one of said candidate reference data sequences the probabilities of said two or more most significant peaks are calculated, followed by the steps:

depending on the number of said two or more most significant peaks, calculating a related number of probabilities that there are a corresponding number of two or more magnitude values in a correlation block which are larger than or equal to these significant peaks;

for each candidate reference data sequence, summing up said related number of probabilities so as to form a total probability value;

regarding that candidate reference data sequence to which the lowest one of said total probability values is assigned as the one having said lowest false positive error.

15. Apparatus according to claim 9, wherein for said current signal section:

a predetermined number of largest magnitude peak values in the correlation result values for non-marked signal content is obtained and these peaks are sorted according to their size, and for each one of said candidate reference data sequences said predetermined number of largest magnitude peak values in the correlation result values is obtained and these peak values are sorted according to their size;

for each one of said candidate reference data sequences said predetermined largest magnitude peak values number of difference values between corresponding pairs of largest magnitude values of the current candidate reference data sequence and for non-marked content are summed up;

selecting that candidate reference data sequence for which the maximum sum of difference values was calculated as the one which was used for marking said current signal section.

16. Apparatus according to claim 9, wherein said second threshold value is smaller than said first threshold value.

* * * * *